(12) United States Patent
zur Loye et al.

(10) Patent No.: US 10,738,239 B2
(45) Date of Patent: Aug. 11, 2020

(54) MIXED ANION CESIUM RARE EARTH SILICATES

(71) Applicant: University of South Carolina, Columbia, SC (US)

(72) Inventors: Hans-Conrad zur Loye, Columbia, SC (US); Allison M. Latshaw, Reading, PA (US); Gregory Morrison, Columbia, SC (US)

(73) Assignee: University of South Carolina, Columbia, SC (US)

( * ) Notice: Subject to any disclaimer, the term of this patent is extended or adjusted under 35 U.S.C. 154(b) by 359 days.

(21) Appl. No.: 15/811,939

(22) Filed: Nov. 14, 2017

(65) Prior Publication Data
US 2018/0134957 A1 May 17, 2018

Related U.S. Application Data

(60) Provisional application No. 62/422,302, filed on Nov. 15, 2016.

(51) Int. Cl.
*C09K 11/77* (2006.01)
*C30B 29/10* (2006.01)
*C30B 9/12* (2006.01)
*C30B 29/12* (2006.01)

(52) U.S. Cl.
CPC ...... *C09K 11/7792* (2013.01); *C09K 11/7774* (2013.01); *C30B 9/12* (2013.01); *C30B 29/10* (2013.01); *C30B 29/12* (2013.01)

(58) Field of Classification Search
CPC ............ C09K 11/7792; C09K 11/7788; C09K 11/777; C09K 11/7774; C30B 9/12; C30B 29/10; C30B 29/12
See application file for complete search history.

(56) References Cited

PUBLICATIONS

Blasse, G., Scintillator materials. Chem. Mater. 1994, 6, 1465-1475.
Burachas, S. P.; Danevich, F. A.; Georgadze, A. S.; Klapdor-Kleingrothaus, H. V.; Kobychev, V. V.; Kropivyansky, B. N.; Kuts, V. N.; Muller, A.; Muzalevsky, V. V.; Nikolaiko, A. S.; Ponkratenko, O. A.; Ryzhikov, V. D.; Sai, A. S.; Solsky, I. M.; Tretyak, V. I.; Zdesenko, Y. G., Large vol. CdWO4 crystal scintillators. Nucl. Instmm. Methods in Phys. Res., Sect. A 1996, 369, 164-168.
Dabić, P.; Kahlenberg, V.; Schmidmair, D.; Kremenović, A.; Vulić, P., Single-crystal X-ray diffraction study of Cs2Er[Si6O14]F and Cs2Er[Si4O10]F. Z. Kristallogr. 2016, 231, 195.
(Continued)

*Primary Examiner* — C Melissa Koslow
(74) *Attorney, Agent, or Firm* — Dority & Manning, P.A.

(57) ABSTRACT

Scintillating compounds, methods of synthesizing scintillating compounds, and applications of scintillating compounds are disclosed. The scintillating compounds can include cesium rare earth silicates. A scintillating compound can include cesium, silicon, oxygen, fluorine, and one or more of europium, gadolinium, terbium, dysprosium, holmium, erbium, thulium, ytterbium, lutetium and scandium. The scintillating compounds can form unit cells having the general formula $Cs_3RESi_4O_{10}F_2$ with RE including rare earth metals, lanthanides, and transition metals.

19 Claims, 3 Drawing Sheets

(56) References Cited

PUBLICATIONS

Dolomanov, O. V.; Bourhis, L. J.; Gildea, R. J.; Howard, J. A. K.; Puschmann, H., OLEX2: A complete structure solution, refinement and analysis program. J. Appl. Cryst. 2009, 42, 339-341.

Huang, M.-Y.; Chen, Y.-H.; Chang, B.-C.; Lii, K.-H., High-temperature, high-pressure hydrothermal synthesis, crystal structure, and luminescence properties of Cs3EuSi6O15, a new europium(III) silicate with a three-dimensional framework structure. Chem. Mater. 2005, 17, 5743-5747.

Kolitsch, U.; Tillmanns, E., Synthesis and crystal structure of a new microporous silicate with a mixed octahedral-tetrahedral framework: Cs3ScSi8O19. Mineral. Mag. 2004, 68, 677-686.

Kolitsch, U.; Wierzbicka-Wieczorek, M.; Tillmanns, E., Crystal chemistry and topology of two flux-grown yttrium silicates, BaKYSi2O7 and Cs3YSi8O19. Can. Mineral. 2009, 47, 421-431.

Latshaw, A. M.; Chance, W. M.; Trenor, N.; Morrison, G.; Smith, M. D.; Yeon, J.; Williams, D. E.; Zur Loye, H.-C., A5RE4X[TO4]4 crystal growth and photoluminescence. Hydroflux synthesis of sodium rare earth silicate hydroxides. CrystEngComm 2015, 17, 4691-4698.

Latshaw, A. M.; Hughey, K. D.; Smith, M. D.; Yeon, J.; Zur Loye, H.-C., Photoluminescent and magnetic properties of lanthanide containing apatites: NaxLn10—x(SiO4)6O2—yFy, CaxLn10—x(SiO4)6O2—yFy (Ln=Eu, Gd, and Sm), Gd9.34(SiO4)6O2, and K1.32Pr8.68(SiO4)6O1.36F0.64. Inorg. Chem. 2015, 54, 876-884.

Latshaw, A. M.; Morrison, G.; Zur Loye, K. D.; Myers, A. R.; Smith, M. D.; Zur Loye, H.-C., Intrinsic blue-white luminescence, luminescence color tunability, synthesis, structure, and polymorphism of K3YSi2O7. CrystEngComm 2016, 18, 2294-2302.

Latshaw, A. M.; Wilkins, B. O.; Hughey, K. D.; Yeon, J.; Williams, D. E.; Tran, T. T.; Halasyamani, P. S.; Zur Loye, H.-C., A5RE4X[TO4]4 crystal growth and photoluminescence. Fluoride flux synthesis of sodium and potassium rare earth silicate oxyfluorides. CrystEngComm 2015, 17, 4654-4661.

Li, H.; Ye, Q.; Hua, N., Influence of fluorine on the structure and luminescence properties of Sm3+ doped strontium titanium silica glass. Key Eng. Mater. 2012, 509, 273-278.

Melcher, C. L.; Schweitzer, J. S., Cerium-doped lutetium oxyorthosilicate: a fast, efficient new scintillator. IEEE Trans. Nucl. Sci. 1992, 39, 502-505.

Morrison, G.; Smith, M. D.; Zur Loye, H.-C., Understanding the formation of salt-inclusion phases: An enhanced flux growth method for the targeted synthesis of salt-inclusion cesium halide uranyl silicates. J. Am. Chem. Soc. 2016, 138, 7121-7129.

Morrison, G.; Tran, T. T.; Halasyamani, P. S.; Zur Loye, H.-C., K8(K5F)U6Si8O40: An intergrowth uranyl silicate. Inorg. Chem. 2016, 55, 3215-3217.

Morrison, G.; Zur Loye, H.-C., Flux growth of [NaK6F][(UO2)3(Si2O7)2] and [KK6Cl][(UO2)3(Si2O7)2]: The effect of surface area to vol. ratios on reaction products. Cryst. Growth Des. 2016, 16, 1294-1299.

Morrison, G.; Zur Loye, H.-C., Simple correction for the sample shape and radial offset effects on SQUID magnetometers: Magnetic measurements on Ln2O3 (Ln=Gd, Dy, Er) standards J Solid State Chem. 2015, 221, 334-337.

Nagarkar, V. V.; Gupta, T. K.; Miller, S. R.; Klugerman, Y.; Squillante, M. R.; ENTINE, G., Structured CsI(Tl) scintillators for X-ray imaging applications. IEEE Trans. Nucl. Sci. 1998, 45, 492-496.

Nikl, M.; Yoshikawa, A.; Kamada, K.; Nejezchleb, K.; Stanek, C. R.; Mares, J. A.; Blazek, K., Development of LuAG-based scintillator crystals—A review. Prog. Cryst. Growth Charact. Mater. 2013, 59, 47-72.

Roof, I. P.; Jagau, T.-C.; Zeier, W. G.; Smith, M. D.; zur Loye, H.-C., Crystal growth of a new series of complex niobates, LnKNaNbO5 (Ln=La, Pr, Nd, Sm, Eu, Gd, and Tb): Structural properties and photoluminescence. Chem. Mater. 2009, 21, 1955-1961.

Roof, I. P.; Smith, M. D.; Park, S.; zur Loye, H.-C., EuKNaTaO5: Crystal growth, structure and photoluminescence property. J. Am. Chem. Soc. 2009, 131, 4202-4203.

Schäfer, M. C.; Schleid, T. Z., Cs3NdSi8O19 and Cs6Nd2Si21O48: Two caesium-containing oxosilicates of neodymium in comparison. Z. Naturforsch. B: Chem. Sci. 2009, 64, 1329-1338.

Schäfer, M. C.; Schleid, T., Synthesis and crystal structure of the fluoride ino-oxosilicate Cs2YFSi4O10. Z. Anorg. Allg. Chem. 2007, 633, 1018-1023.

Sheldrick, G. M., A short history of SHELX. Acta Crystallogr. A 2008, 64, 112-122.

Sheldrick, G., SHELXT—Integrated space-group and crystal-structure determination. Acta Crystallogr. A 2015, 71, 3-8.

Spanoudaki, V. C.; Ziegler, S. I., PET & SPECT Instrumentation. In Molecular Imaging I, Semmler, W.; Schwaiger, M., Eds. Springer Berlin Heidelberg: Berlin, Heidelberg, 2008; pp. 53-74.

Spek, A. L. Single-crystal structure validation with the program Platon. J. Appl. Crystallogr. 2003, 36, 7-13.

Spek, A. L., PLATON, An integrated tool for the analysis of the results of a single crystal structure determination. Acta Crystallogr. A 1990, 46, C34.

Touš, J.; Blažek, K.; Pína, L.; Sopko, B., High-resolution imaging of biological and other objects with an X-ray digital camera. Appl. Radiat. Isot. 2010, 68, 651-653.

Van Eijk, C. W. E., Inorganic-scintillator development. Nucl. Instrum. Methods Phys. Res., Sect. A 2001, 460, 1-14.

West, H. I.; Meyerhof, W. E.; Hofstadter, R., Detection of X-rays by means of NaI(Tl) scintillation counters. Phys. Rev. 1951, 81, 141-142.

Yeon, J.; Hardaway, J. B.; Sefat, A. S.; Latshaw, A. M.; zur Loye, H.-C., Crystal growth, structures, magnetic and photoluminescent properties of NaLnGeO4 (Ln=Sm, Eu, Gd, Tb). Solid State Sci. 2014, 34, 24-30.

Yoshida, E.; Hirano, Y.; Tashima, H.; Inadama, N.; Nishikido, F.; Moriya, T.; Omura, T.; Watanabe, M.; Murayama, H.; Yamaya, T., The X'tal cube PET detector with a monolithic crystal processed by the 3D sub-surface laser engraving technique: Performance comparison with glued crystal elements. Nucl. Instrum. Methods in Phys. Res., Sect. A 2013, 723, 83-88.

Zhao, X.; Li, J.; Chen, P.; Li, Y.; Chu, Q.; Liu, X.; Yu, J.; Xu, R., New lanthanide silicates based on anionic silicate chain, layer, and framework prepared under high-temperature and high-pressure conditions. Inorg. Chem. 2010, 49, 9833-9838.

MIXED ANION CESIUM RARE EARTH SILICATES

CROSS-REFERENCE TO A RELATED APPLICATION

The present application claims priority to U.S. Provisional Patent Application Ser. No. 62/422,302 titled "Materials Discovery by Crystal Growth: Synthesis, Structure Determination, Magnetic, and Optical Properties of Complex Lanthanide Containing Oxides, Oxyhydroxides, and Oxyfluorides" of Latshaw, et al. filed on Nov. 15, 2016, the disclosure of which is incorporated by reference herein.

GOVERNMENT SUPPORT

The subject invention was made with government support under a research project supported by the National Science Foundation grant number DMR-1301757. The government has certain rights in the invention.

BACKGROUND OF THE INVENTION

X-ray and γ-ray scintillators are important due to their extensive use in X-ray photography, X-ray phosphors, positron emission tomography (PET), computer tomography (CT) scanners, and, more recently, in large scale radiation detectors used at ports and border crossings. Currently used inorganic scintillators fall into two major groups, the ionic halides and covalent oxides. Depending on the intended application, sensitivity to different radiation sources is needed and most scintillators work best for only a single type of application. The application specific features for an ideal scintillator include a high light yield, a fast response time, high energy resolution, and chemical (moisture) inertness. Optimizing these features makes the development of new scintillators of continuing interest.

BRIEF SUMMARY OF THE INVENTION

Embodiments of the present disclosure include scintillating compounds and methods of synthesizing scintillating compounds. More specifically, embodiments of the present disclosure are directed toward cesium rare earth silicates and the synthesis of cesium rare earth silicates. Embodiments also include applications for cesium rare earth silicate compounds.

An enhanced flux growth technique for the targeted growth of mixed anion systems containing both oxygen and a halide ion, typically fluorine, was developed. The method can be used to synthesize a number of uranyl silicate salt-inclusion compounds. The method can also be used for the synthesis of a second structural class of mixed anion system oxyfluorides. Using the method, rare earth silicate oxyfluorides, $Cs_3RESi_4O_{10}F_2$ (RE=Sc, Y, and Eu—Lu), can be prepared that crystallize in unique structures and silicate sheet topologies. The present disclosure teaches the synthesis, structure, magnetic and optical properties of these compounds including intense X-ray scintillation.

A scintillating compound of the present disclosure can include cesium, silicon, oxygen, fluorine, and one or more of europium, gadolinium, terbium, dysprosium, holmium, erbium, thulium, ytterbium, lutetium and scandium. The scintillating compounds can also include a mixture of two, three, or more of europium, gadolinium, terbium, dysprosium, holmium, erbium, thulium, ytterbium, lutetium and scandium. The scintillating compounds can take the form of crystals having a unit cell defined by $Cs_3RESi_4O_{10}F_2$, in which RE (generally rare earth elements) can be europium, gadolinium, terbium, dysprosium, holmium, erbium, thulium, ytterbium, lutetium, yttrium, and scandium, as well as mixtures thereof.

DETAILED DESCRIPTION OF THE INVENTION

Embodiments of the present disclosure include scintillating compounds and methods of synthesizing scintillating compounds. More specifically, embodiments of the present disclosure are directed toward cesium rare earth silicates and the synthesis thereof. Embodiments also include applications for cesium rare earth silicate compounds, such as optical and magnetic applications.

Numerous elements and compounds will be discussed throughout the present disclosure. All elemental abbreviations, symbols, and atomic numbers are made with reference to the periodic table and nomenclature as established by the International Union of Pure and Applied Chemistry (IUPAC). Furthermore, all percentages and ratios discussed are molar percentages and molar ratios unless expressly stated otherwise.

The scintillation process begins when radiation (X-rays, γ-rays or neutrons) is absorbed by a material. For X-ray and γ-ray scintillators, materials with high densities and high atomic numbered elements are important to maximize their absorption of electromagnetic radiation. The electromagnetic radiation is absorbed through the photoelectric effect, the Compton Effect, and pair production, and ultimately results in electron and hole pairs within the material. These pairs can get trapped by a luminescent center and recombine emitting visible light, which enables these materials to luminescence. The inventor investigated many lanthanide containing covalent oxides for their luminescent properties, including numerous silicates. Empirically, it was observed that the inclusion of fluorine into the embodiments can unexpectedly increase luminescence efficiency. Similar behavior has also been observed in silicate glasses.

A scintillating compound of the present disclosure can include cesium, silicon, oxygen, fluorine, and one or more of europium, gadolinium, terbium, dysprosium, holmium, erbium, thulium, ytterbium, lutetium, yttrium, scandium, or a combination thereof (i.e., elements 63 to 71, element 39, and element 21 of periodic table). For instance, the scintillating compounds can also include a mixture of two, three, or more of europium, gadolinium, terbium, dysprosium, holmium, erbium, thulium, ytterbium, lutetium, yttrium, scandium, or a combination thereof. For instance, the scintillating compounds can take the form of crystals having a unit cell or chemical formula defined by $Cs_3RESi_4O_{10}F_2$, where RE (rare earth elements) can include europium, gadolinium, terbium, dysprosium, holmium, erbium, thulium, ytterbium, lutetium, yttrium, and scandium, as well as mixtures thereof.

Figure 1:
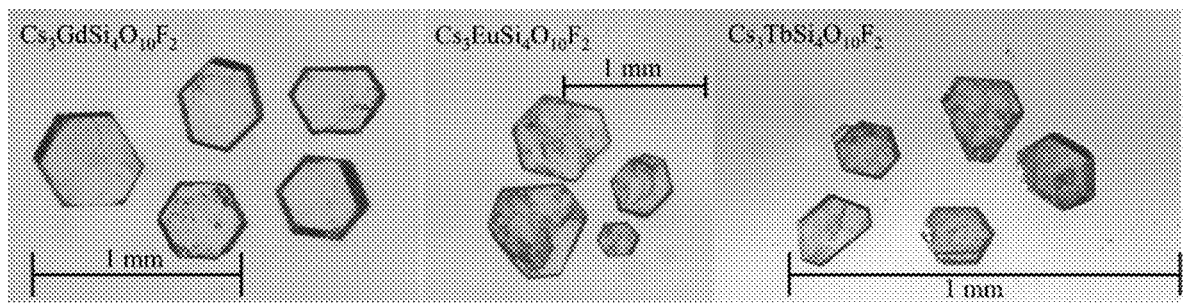
FIG. 1 shows images of crystals of $Cs_3RESi_4O_{10}F_2$ (RE=Gd, Eu, Tb).

Embodiments of the present disclosure include mixed crystals that generally follow the chemical formula $Cs_3RESi_4O_{10}F_2$, wherein RE is a variable element or mixture of elements. FIG. 1 shows images of crystals having the general formula $Cs_3RESi_4O_{10}F_2$ (RE=Gd, Eu, Tb). Instead of RE representing a single element, in some embodiments the crystals can include a mixture of two, three, four, or even more elements in the RE position. Binary mixtures having the general formula $Cs_3RESi_4O_{10}F_2$ will now be disclosed. However, it should be noted that a tertiary element, and even a quaternary element, can be provided at the RE position in addition to the recited binary mixture. Furthermore, one skilled in the art will realize that lesser amounts of alternative elements (e.g., elements 21, 39, and 63-71) can be added without materially affecting the properties of the binary mixtures, and can therefore be viewed as equivalent compositions.

In an embodiment, the RE can include a mixture of yttrium and europium, and the formula can be defined by $Cs_3(Y_{1-x}Eu_x)Si_4O_{10}F_2$, wherein 0<x<1. In a specific example, the RE element can be from about 90.0% to about 99.9% yttrium, from about 92.0% to about 98.0% yttrium, or from about 93.5% to about 96.5% yttrium. The RE element can also include from about 0.1% to about 10% europium, from about 2.0% to about 8.0% europium, or from about 3.5% to about 6.5% europium.

Embodiments can also include mixtures of yttrium and terbium, represented by the formula $Cs_3(Y_{1-x}Tb_x)Si_4O_{10}F_2$, wherein 0<x<1. In a specific example, the RE element can be from about 80.0% to about 99.9% yttrium, from about 85.0% to about 95.0% yttrium, or from about 88.0% to about 92.0% yttrium. The RE element can also include from about 0.1% to about 20% terbium, from about 5.0% to about 15.0% terbium, or from about 8.0% to about 12.0% terbium.

Another embodiment can include a mixture of gadolinium and europium, and the formula can generally be defined by $Cs_3(Gd_{1-x}Eu_x)Si_4O_{10}F_2$, wherein 0<x<1. In a specific example, the RE element can be from about 90.0% to about 99.9% gadolinium, from about 92.0% to about 98.0% gadolinium, or from about 93.5% to about 96.5% gadolinium. The RE element can also include from about 0.1% to about 10% europium, from about 2.0% to about 8.0% europium, or from about 3.5% to about 6.5% europium.

Embodiments can also include mixtures of gadolinium and terbium, represented generally by the formula $Cs_3(Gd_{1-x}Tb_x)Si_4O_{10}F_2$, where 0<x<1. In a specific example, the RE element can be from about 80.0% to about 99.9% gadolinium, from about 85.0% to about 95.0% gadolinium, or from about 88.0% to about 92.0% gadolinium. The RE element can also include from about 0.1% to about 20% terbium, from about 5.0% to about 15.0% terbium, or from about 8.0% to about 12.0% terbium.

Another embodiment can include a mixture of lutetium and europium, and the formula can be defined by $Cs_3(Lu_{1-x}Eu_x)Si_4O_{10}F_2$, where 0<x<1. In a specific example, the RE element can be from about 90.0% to about 99.9% lutetium, from about 92.0% to about 98.0% lutetium, or from about 93.5% to about 96.5% lutetium. The RE element can also include from about 0.1% to about 10% europium, from about 2.0% to about 8.0% europium, or from about 3.5% to about 6.5% europium.

Embodiments can also include mixtures of lutetium and terbium, represented generally by the formula $Cs_3(Lu_{1-x}Tb_x)Si_4O_{10}F_2$, where 0<x<1. In a specific example, the RE element can be from about 80.0% to about 99.9% lutetium, from about 85.0% to about 95.0% lutetium, or from about 88.0% to about 92.0% lutetium. The RE element can also include from about 0.1% to about 20% terbium, from about 5.0% to about 15.0% terbium, or from about 8.0% to about 12.0% terbium.

Embodiments also include methods for synthesizing scintillating compounds that include cesium, silicon, oxygen, fluorine, and RE, wherein RE can include europium, gadolinium, terbium, dysprosium, holmium, erbium, thulium, ytterbium, lutetium, yttrium, scandium, or a combination thereof. The method can begin by mixing $REF_3$ (or $RECl_3$), $SiO_2$, CsF, and CsCl. Instead of these specific reagents, other equivalent reagents can be used as sources of RE, fluorine, silicon, oxygen, and cesium. Furthermore, all of the mixtures of RE elements discussed above can be incorporated into the synthesis process to produce binary, tertiary, and quaternary mixtures. For example, the $REF_3$ in the reaction mixture can include from about 90.0% to about 99.9% yttrium ($YF_3$) and from about 0.1% to about 10.0% europium ($EuF_3$).

In a specific embodiment, the method can begin by layering a mixture of $REF_3$ and $SiO_2$ beneath a mixture of CsF and CsCl. The mixture of $REF_3$, $SiO_2$, CsF, and CsCl can then be heated. More specifically, the mixture can be heated to from about 500° C. to about 1000° C., and more particularly from about 600° C. to about 900° C. The mixture can be held at this temperature for from 6 to 24 hours, and more preferably from 8 to 16 hours.

After dwelling at an elevated temperature to help drive the reaction and form the scintillation compound, the mixture can be slow cooled to an intermediate temperature of from about 300° C. to about 500° C., and more particularly from about 350° C. to about 450° C. The cooling can take place at a rate of from 1° C./h to 20° C./h, from 2° C./h to 15° C./h, or from 3° C./h to 10° C./h. The mixture can continue to be slow cooled to room temperature. Alternatively, once the intermediate temperature is reached, the mixture can be rapidly cooled to room temperature. However, allowing the mixture to slow cool can produce more uniform and higher quality crystals.

Figure 2:
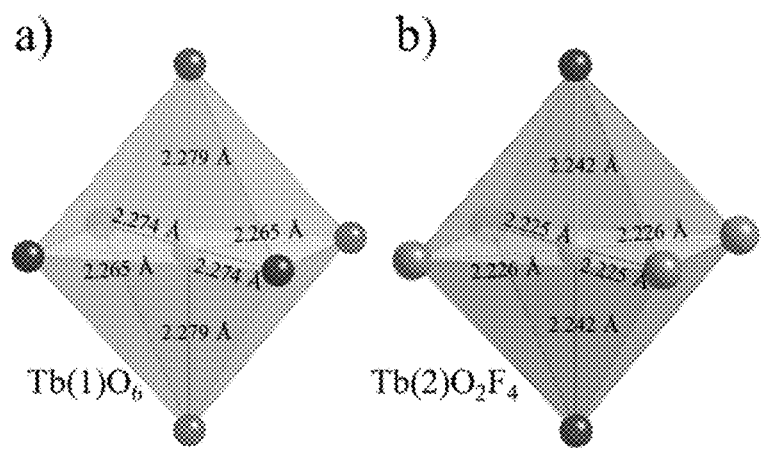
FIG. 2 shows diagrams of (a) $Tb(1)O_6$ and (b) $Tb(2)O_2F_4$ polyhedra in $Cs_3TbSi_4O_{10}F_2$, including interatomic distances.

$Cs_3RESi_4O_{10}F_2$ generally crystallizes in the triclinic space group P-1 with lattice parameters a=7.0832(2) Å, b=7.1346(2) Å, c=16.2121(5) Å, $\alpha$=95.8090(10°), $\beta$=90.1000(10°), and $\gamma$=119.7600(10°) for the terbium analogue. The asymmetric unit contains three cesium sites, two rare earth sites, four silicon sites, ten oxygen sites, and two fluorine sites. The RE(1) site, shown in FIG. 2a, is coordinated by six oxygen atoms to form a slightly distorted $RE(1)O_6$ octahedron with bond distances of 2.265(2)-2.279(2) Å for the Tb analogue. The RE(2) site, shown in FIG. 2b, is coordinated by two oxygen atoms and four fluorine atoms to form a slightly distorted $RE(1)O_2F_4$ octahedron with bond distances of 2.242(2) Å (RE-O) and 2.225(3)-2.226(3) Å (RE-F) for the terbium analogue.

Figure 3:
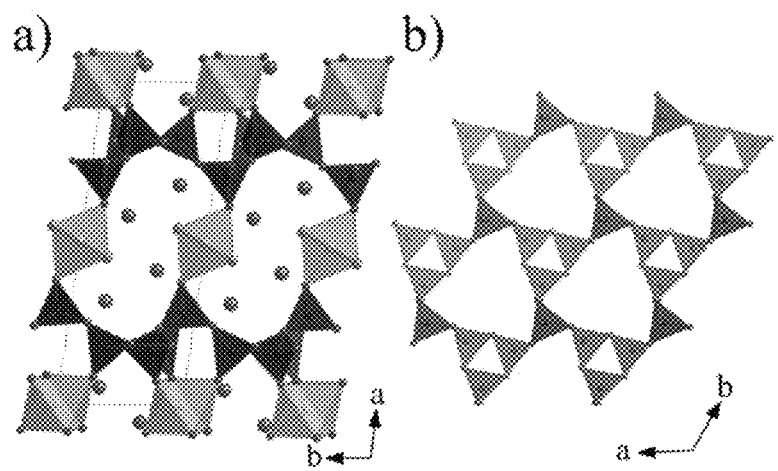
FIG. 3 shows (a) the structure of $Cs_3TbSi_4O_{10}F_2$ and (b) the $Si_4O_{10}$ silicate sheet topology.

FIG. 3(a) shows the structure of $Cs_3TbSi_4O_{10}F_2$. The cesium atoms lie in voids within the rare earth slabs and provide charge balance to the overall anionic framework. The silicon atoms are coordinated by four oxygen atoms to form $SiO_4$ tetrahedra with bond distances of 1.565(2)-1.649

Figure 4:
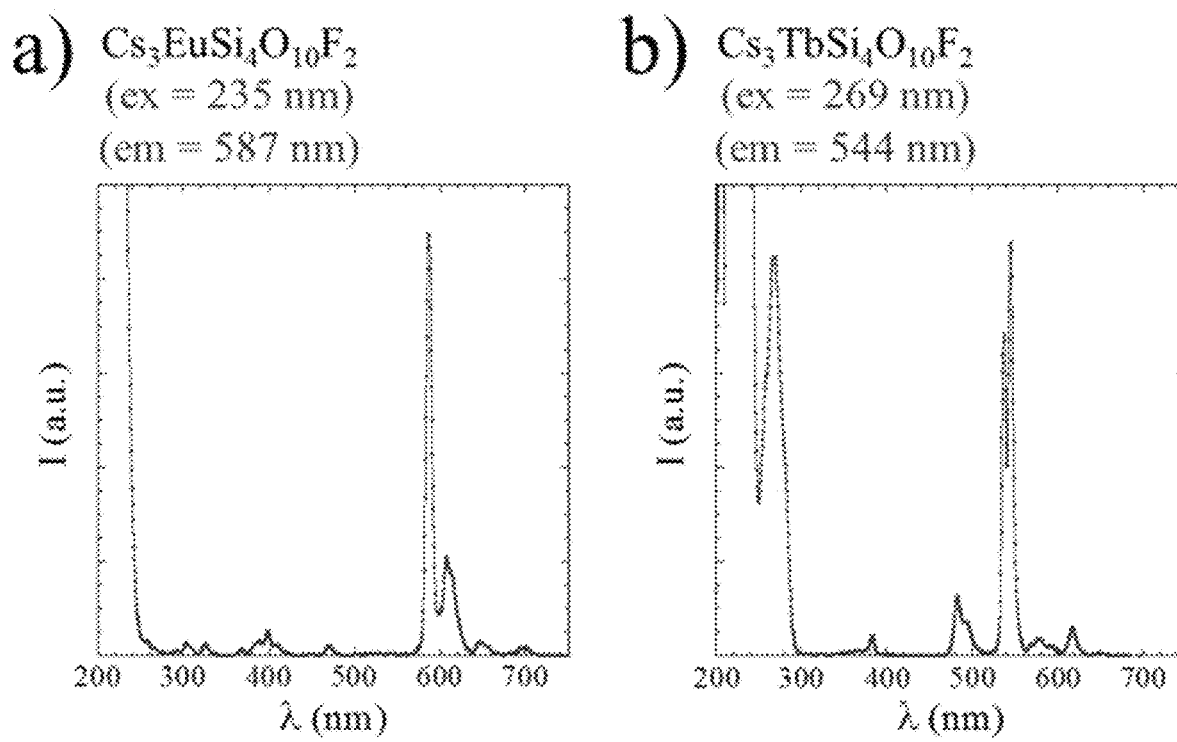
FIG. 4 shows luminescence spectra for (a) $Cs_3EuSi_4O_{10}F_2$ and (b) $Cs_3TbSi_4O_{10}F_2$.

(2) Å for the terbium analogue. The $SiO_4$ tetrahedra connect to form a $Si_4O_{10}$ silicate sheet topology consisting of $Si_3O_9$ rings connected through a fourth $SiO_4$ group as seen in FIG. 3b. These sheets lie in the ab-plane and are connected in the c-direction by alternating slabs of isolated $RE(1)O_6$ and $RE(2)O_2F_4$ polyhedra that corner share with the silicate sheets. There are numerous silicate topologies with isolated $SiO_4$ and corner shared $Si_2O_7$ pyrosilicate units being the most prevalent. Larger isolated units, such as $Si_3O_9$ and $Si_6O_{17}$ units, and silicate sheets are less common and the particular variant of $Si_4O_{10}$ disclosed herein is not believed to have been reported. It is possible that the presence of the fluorine anions attached to the rare earth cations in the $RE_2O_2F_4$ polyhedra limits geometrically the available points of attachment to the silicate sheets, thus favoring this particular silicate sheet topology Optical properties of $Cs_3RESi_4O_{10}F_2$ will now be discussed. FIG. 4a shows the luminescence spectra for $Cs_3EuSi_4O_{10}F_2$. The excitation spectrum is typical of $Eu^{3+}$ containing compounds with an intense band below ~270 nm and several weak excitation bands, including those at 303, 325, 398 and 470 nm. The emission spectrum consists of four peaks, two intense peaks at 586 and 607 nm that arise due to the $D_0$-$F_1$ transition and two broad, weak emission peaks at 646 and 699 nm that are associated with the $D_0$-$F_2$ transition. The high intensity of the first two peaks and low intensity of the latter two is indicative of a centrosymmetric structure.

The fluorescence spectra of $Cs_3TbSi_4O_{10}F_2$ are shown in FIG. 4b. The excitation spectrum consists of three bands, an intense band below 250 nm, a band of intermediate intensity at 268 nm, and a weak band at 383 nm. The emission spectrum consists of a doublet at 483 and 492 nm, an intense doublet at 537 and 545 nm, a broad band at 578 nm and a singlet at 618 nm, corresponding to the $D_4$-$F_6$, $D_4$-$F_5$, $D_4$-$F_4$, and $D_4$-$F_3$ transitions, respectively.

Figure 5:
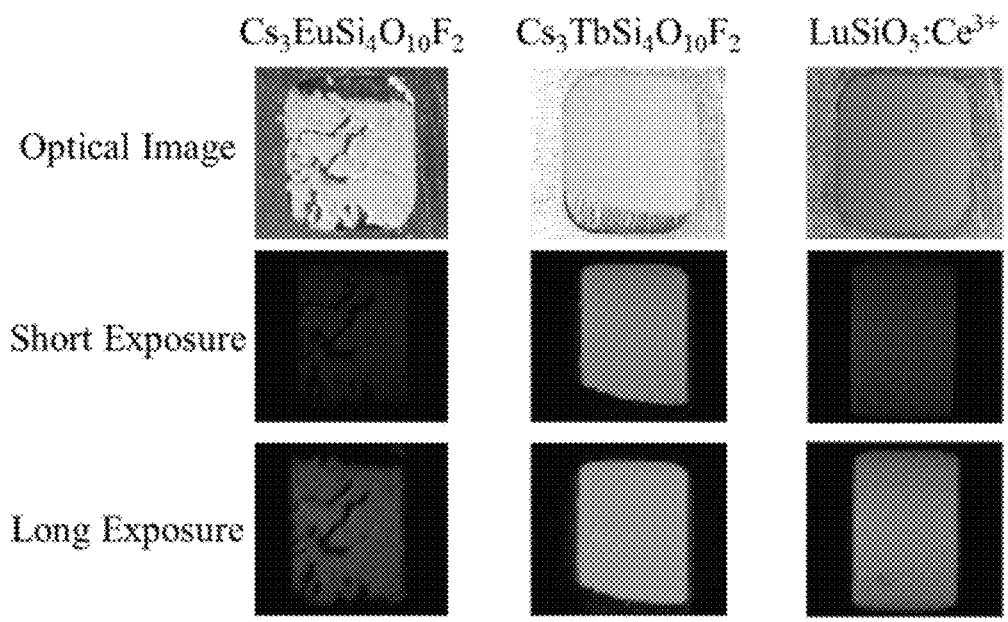
FIG. 5 shows images of $Cs_3EuSi_4O_{10}F_2$ (left), $Cs_3TbSi_4O_{10}F_2$ (center), and $LuSiO_5$:Ce (right). The top images are optical images, the middle images show scintillation after a short exposure to laboratory X-rays, and the bottom images show scintillation after long-term exposure to laboratory X-rays (Cu $K_\alpha$ radiation).

FIG. 5 shows the scintillation of $Cs_3RESi_4O_{10}F_2$ (RE=Eu and Tb). Images were taken under exposure to laboratory X-rays, Cu Kα radiation. As a qualitative indicator of intensity, scintillation images were also taken of 1% Ce doped $LuSiO_5$, one of the best inorganic scintillators. $Cs_3EuSi_4O_{10}F_2$ scintillates the typical orange-red of $Eu^{3+}$ and is similar in intensity to the $LuSiO_5$:$Ce^{3+}$ standard. Scintillation makes use of the same light emission process as fluorescence and, hence, the scintillation emission matches the wavelengths of the fluorescence emission. $Cs_3TbSi_4O_{10}F_2$ scintillates the typical green color of $Tb^{3+}$ and is visually more intense than the $LuSiO_5$:$Ce^{3+}$ standard.

Figure 6:
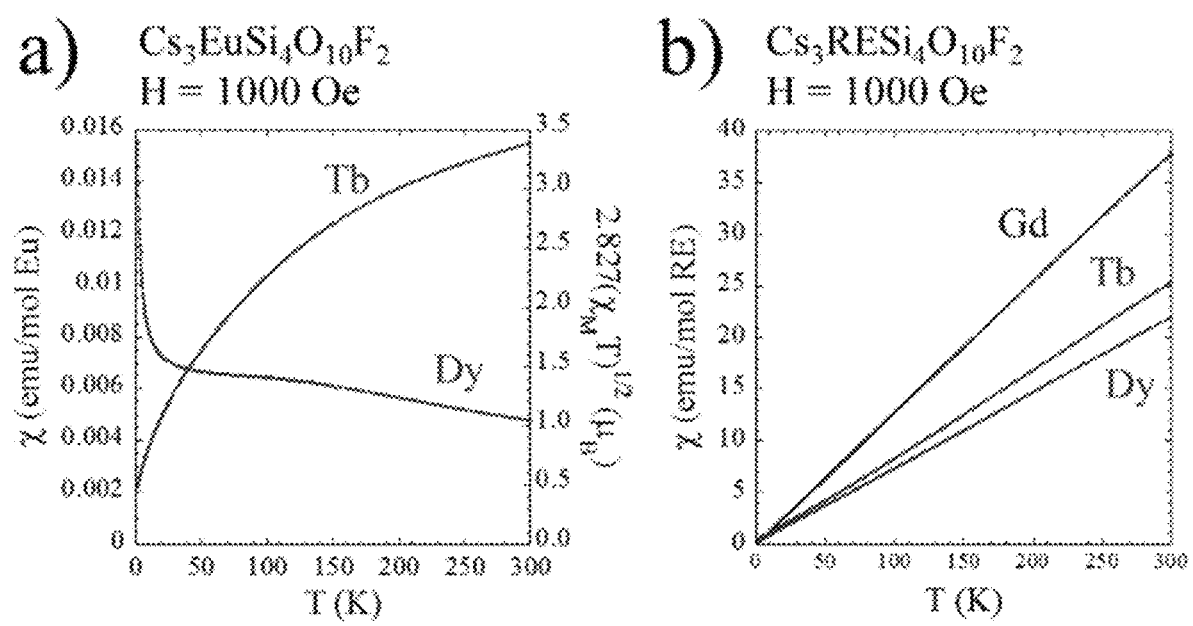
FIG. 6 shows graphs illustrating the temperature dependent magnetic properties of (a) $Cs_3EuSi_4O_{10}F_2$ and (b) $Cs_3RESi_4O_{10}F_2$ (RE=Gd—Dy).

Magnetic properties of $Cs_3RESi_4O_{10}F_2$ will now be discussed. FIG. 6a shows the inverse susceptibilities for $Cs_3RESi_4O_{10}F_2$ (RE=Gd—Dy). All three compounds follow Curie-Weiss behavior over the entire measured temperature range. Fitting the susceptibilities to the Curie-Weiss law results in effective moments of 7.93(3) $\mu_B$/Gd, 9.68(3) $\mu_B$/Tb, and 10.44(3) $\mu_B$/Dy, which agree with the calculated moments of 7.94$\mu_B$/Gd, 9.72 $\mu_B$/Tb, and 10.61$\mu_B$/Dy for free $RE^{3+}$ ions. No magnetic ordering was observed down to 2 K and the Weiss temperatures of −1.3 K (Gd), −2.3 K (Tb), and −0.3 K (Dy) suggest extremely weak coupling between the f-electrons of adjacent RE ions. The magnetic susceptibility of $Cs_3EuSi_4O_{10}F_2$, shown in FIG. 6b, displays Van Vleck paramagnetism as is expected for $Eu^{3+}$. The effective moment can be approximated as $2.827(\chi_M T)^{1/2}$. This approximation yields a moment of 3.38(3) $\mu_B$/Eu, which agrees with the moment of 3.4$\mu_B$/Eu typically observed in $Eu^{3+}$ containing compounds. The magnetic data are summarized in Table 1.

TABLE 1

Magnetic Properties for $Cs_3RESi_4O_{10}F_2$ (RE = Eu, Gd, Tb, Dy)

| | H (T) | Fit Range (K) | θ (K) | $\mu_{eff}$ ($\mu_B$/RE)[a] | $\mu_{calc}$ ($\mu_B$/RE)[b] |
|---|---|---|---|---|---|
| $Cs_3EuSi_4O_{10}F_2$ | 0.1 | 300 | | 3.38(3) | 3.4 |
| $Cs_3GdSi_4O_{10}F_2$ | 0.1 | 50-300 | −1.3 | 7.96(3) | 7.94 |
| $Cs_3TbSi_4O_{10}F_2$ | 0.1 | 50-300 | −2.3 | 9.68(3) | 9.72 |
| $Cs_3DySi_4O_{10}F_2$ | 0.1 | 50-300 | −0.3 | 10.44(3) | 10.61 |

[a]Approximated using $2.827(\chi T)^{1/2}$ at 300 K
[b]Moment typically observed for Eu(III) compounds A greater understanding of the embodiments and their advantages may be had from the following examples, given by way of illustration. The following examples are illustrative of some of the methods, applications, embodiments and variants of the present invention. They are, of course, not to be considered as limiting the invention. Numerous changes and modifications can be made yet still fall within the scope of the present invention.

Example 1

Single crystals of $Cs_3RESi_4O_{10}F_2$ were grown using an enhanced flux growth technique for the synthesis of mixed anion systems. For the Eu—Dy analogues, single crystals of suitable size and quality for single crystal X-ray diffraction were grown by layering a mixture of 1 mmol $REF_3$ (Alfa Aesar, powder, 99.9%) and 1 mmol $SiO_2$ (Alfa Aesar, powder, 99.9%) beneath a mixture of 9 mmol CsF (Alfa Aesar, powder, 99%) and 11 mmol CsCl (Alfa Aesar, crystalline, 99%) in a 5.7 cm tall by 1.2 cm diameter cylindrical silver crucible. The loaded crucibles were loosely covered with a silver lid and placed into a programmable furnace. The reactions were heated at 600° C./h to 900° C., dwelled at this temperature for 12 h, slow cooled to 400° C. at 6° C./h and then rapidly cooled to room temperature by shutting the furnace off. After cooling, the frozen flux was dissolved in distilled water, aided by sonication, and the resulting products were isolated via vacuum filtration. Single crystals of suitable size for crystal picking were grown using a similar method except that 1 mmol $RECl_3.xH_2O$ (Alfa Aesar, crystalline, 99.9%) and 4 mmol $SiO_2$ were used. For the remaining analogues, single crystals of suitable size and quality for single crystal X-ray diffraction were grown using 1 mmol $RECl_3.xH_2O$ and either 1 mmol or 4 mmol $SiO_2$.

When using 1 mmol of $RECl_3.xH_2O$ and 4 mmol $SiO_2$, the Eu—Dy reactions yielded $Cs_3RESi_4O_{10}F_2$, $Cs_3RES_6O_{15}$, and AgCl as the major products. The title compound formed as thick hexagonal plates that could easily be distinguished from the $Cs_3RESi_6O_{15}$ by their morphology, the latter forming as equant crystals. The Ho—Yb reactions yielded $Cs_3RESi_4O_{10}F_2$, $Cs_3RESi_6O_{15}$, $RE_2O_3$ and AgCl as the major products.

Multiple additional binary mixtures of $Cs_3RESi_4O_{10}F$ compounds were also prepared. Specifically, compounds were prepared with RE being: about 95% yttrium and about 5% europium; about 95% yttrium and about 5% terbium; about 95% gadolinium and about 5% europium; about 97% gadolinium and about 3% europium; about 99.5% gadolinium and about 0.5% europium; about 90% gadolinium and about 10% terbium; about 95% gadolinium and about 5% terbium; about 97% gadolinium and about 3% terbium; about 95% lutetium and about 5% europium; and about 95% lutetium and about 5% terbium. In describing the binary

Example 2

Structure determination for $Cs_3RESi_4O_{10}F_2$ was performed using single crystal X-ray diffraction (SXRD) data collected on a Bruker D8 Quest diffractometer equipped with a Mo Kα microfocus source (λ=0.71073 Å). Diffraction data were collected and integrated using SAINT and corrected for absorption effects using SADABs in the APEX 3 software suite. For the Dy analogue, an initial structure solution was obtained via direct methods using ShelXT and refined using ShelXS in Olex2. For the other analogues, models were either obtained in the aforementioned method or by using the atomic coordinates of a solved structure as a starting point.

All crystals studied via SXRD were found to be pseudo-merohedrally twinned to mimic a C-centered monoclinic lattice with the lattice parameters of a=12.3925(4) Å, b=7.0859(2) Å, c=16.1873(6) Å, and β=96.7040(10)° for the Dy analogue. Structures modeled with these lattice parameters resulted in a high R value (0.1111 for Dy analogue) and a high number of large residual electron density peaks (largest peak for Dy analogue=6.3 $e^-/Å^3$) in the silicate sheet portion of the structure. The actual symmetry was determined to be triclinic with lattice parameters of a=7.0856(2) Å, b=7.1360(3) Å, c=16.1856(5) Å, α=95.7630(10)°, β=90.1000(10)°, and γ=119.7430(10)° for the Dy analogue. The TwinRotMat functionality in the Platon suite was used to determine the relevant twin law, 1 0 0 -1 -1 0 0 0 -1 in each case, which was then accounted for using the TWIN and BASF commands in ShelXL. Modeling in the triclinic cell and accounting for the twin law lead to a much better R value (0.0258 for the Dy analogue) and a much flatter residual electron density map (highest peak for Dy analogue=2.6 $e^-/Å^3$ located next to a Cs atom).

Along with pseudo-merohedral twinning, many crystals were also non-merohedrally twinned, necessitating careful selection of crystals for X-ray diffraction. This twinning became more pronounced in the latter rare earth analogues. Ultimately, no crystals without non-merohedral twinning were found for the Tm and Lu analogues. For these two analogues, Cell_Now was used to paint the peaks of each non-merohedral twin prior to integrating the images with SAINT. Absorption correction was performed using TWIN-ABS which produced an HKLF 4 reflection file containing single and composite reflections for a single twin domain. This set of reflections, as opposed to an HKLF5 reflection file containing reflections from both domains, was used for structure solution and refinement as it allows for the further inclusion of the pseudo-merohedral twinning.

Phase purity of ground samples of picked single crystals was confirmed using powder X-ray diffraction data. Diffraction data were collected on a Bruker D2 Phaser equipped with a Cu Kα source (λ=1.54018 Å).

Example 3

Fluorescence data were collected on ground samples of $Cs_3RESi_4O_{10}F_2$ (RE=Eu and Tb) using a Perkin Elmer LS55 Luminescence Spectrometer. Excitation spectra were collected at emission wavelengths of 587 nm (Eu) and 544 nm (Tb) and emission scans were collected at excitation wavelengths of 235 nm (Eu) and 269 nm (Tb).

Scintillation images of $Cs_3RESi_4O_{10}F_2$ (RE=Eu and Tb) were taken using a Rigaku Ultima IV diffractometer equipped with a Cu Kα source (λ=1.54018 Å). As a qualitative indicator of intensity, a scintillation image of $LuSiO_5$:$Ce^{3+}$ (0.5 atom % Ce in Lu) was also taken. This sample was prepared via the solid-state reaction of $Lu_2O_3$, $CeO_2$, and $SiO_2$ heated at 1400° C. for a total of 2.5 days with intermittent grindings.

Magnetic susceptibility data were collected on ground samples of $Cs_3RESi_4O_{10}F_2$ (RE=Eu—Dy) using a Quantum Design Magnetic Properties Measurement System (QD-MPMS3 SQUID). Data were collected under zero-field-cooled (ZFC) conditions at an applied field of 1000 Oe. The raw data were corrected for sample shape and radial offset effects based on the difference between the raw moments measured using the VSM and DC scan modes at 30 K.

Example 4

An enhanced flux growth method for the synthesis of mixed anion compounds, namely oxyhalides and salt-inclusion materials, was utilized. The method included two enhancements that increase the likelihood of non-oxygen anions being incorporated into the formed crystals. The first enhancement included the use of reaction vessels with a small surface area to volume ratio, which decreases the availability of oxygen to the melt, making the inclusion of other anions more likely. For example, using the crucible previously described, the reaction of 1 mmol $TbCl_3.6H_2O$ and 4 mmol $SiO_2$ resulted in the formation of the desired product, $Cs_3TbSi_4O_{10}F_2$, while performing the same reaction in a 24 mL high form Pt crucible resulted in the formation of an $A_2MSi_3O_9$ related phase, but not of $Cs_3TbSi_4O_{10}F_2$. The second enhancement included the utilization of metal halide reagents ($LnF_3$, $LnCl_3$) as opposed to metal oxide reagents, which is also believed to decrease the oxygen anion concentration within the melt. While the reaction between 1 mmol $GdF_3$ and 1 mmol $SiO_2$ beneath a mixture of 9 mmol CsF and 11 mmol CsCl results in the formation of $Cs_3GdSi_4O_{10}F_2$, the reaction between 0.5 mmol $Gd_2O_3$ and 4 mmol $SiO_2$ beneath a mixture of 9 mmol CsF and 11 mmol CsCl conducted in the aforementioned cylindrical silver crucible resulted in the formation of $Cs_3GdSi_6O_{15}$ as the major product, with no evidence of any $Cs_3GdSi_4O_{10}F_2$.

Other work using the enhanced flux growth technique explored the mixed anion alkali uranyl silicate phase space. The resulting mixed anion phases were salt-inclusion compounds. The formation of salt-inclusion compounds, as opposed to oxyhalides, was attributed to two factors, the favorability of M-O bonds over M-X bonds (M=multivalent cation; X=halide ion) in uranyl silicates and the low anionicity of the framework. That is, since the uranyl oxygens and silicate oxygens within uranyl silicates cannot be substituted by halide ions, the formation of salt-inclusion compounds is favorable as they contain no M-X bonds. In the case of lanthanide silicates, the lanthanide cations are able to accommodate both RE-X and RE-O bonds, allowing for the formation of oxyhalides.

The present disclosure includes explanations of theories that are believed to be behind the advantageous performance aspects of the various embodiments. However, these theories are only intended to be explanatory in nature and are not intended to limit the scope of the embodiments. The embodiments may certainly incorporate and utilize various other theories or phenomena in operation. Furthermore, the theories discussed may not be applicable to all of the embodiments. It should also be understood that the examples and embodiments described herein are for illustrative purposes only and that various modifications or changes in light thereof will be suggested to persons skilled in the art and are to be included within the spirit and scope of this disclosure.

The invention claimed is:

1. A scintillating compound having the formula: $Cs_3RESi_4O_{10}F_2$; wherein
RE comprises europium, gadolinium, terbium, dysprosium, holmium, erbium, thulium, ytterbium, lutetium, scandium, yttrium or a combination thereof.

2. The scintillating compound of claim 1, wherein RE includes a mixture of yttrium and europium.

3. The scintillating compound of claim 2, wherein RE includes from about 90.0 mol % yttrium to about 99.9 mol % yttrium and from about 0.1 mol % europium to about 10 mol % europium.

4. The scintillating compound of claim 1, wherein RE includes a mixture of yttrium and terbium.

5. The scintillating compound of claim 4, wherein RE includes from about 80.0 mol % yttrium to about 99.9 mol % yttrium and from about 0.1 mol % terbium to about 20 mol % terbium.

6. The scintillating compound of claim 1, wherein RE includes a mixture of gadolinium and europium.

7. The scintillating compound of claim 6, wherein RE includes from about 90.0 mol % gadolinium to about 99.9 mol % gadolinium and from about 0.1 mol % europium to about 10 mol % europium.

8. The scintillating compound of claim 1, wherein RE includes a mixture of gadolinium and terbium.

9. The scintillating compound of claim 8, wherein RE includes from about 80.0 mol % gadolinium to about 99.9 mol % gadolinium and from about 0.1 mol % terbium to about 20 mol % terbium.

10. The scintillating compound of claim 1, wherein RE includes a mixture of lutetium and europium.

11. The scintillating compound of claim 10, wherein RE includes from about 90.0 mol % lutetium to about 99.9 mol % lutetium and from about 0.1 mol % europium to about 10 mol % europium.

12. The scintillating compound of claim 1, wherein RE includes a mixture of lutetium and terbium.

13. The scintillating compound of claim 12, wherein RE includes from about 80.0 mol % lutetium to about 99.9 mol % lutetium and from about 0.1 mol % terbium to about 10 mol % terbium.

14. A method for synthesizing a scintillating compound having the formula: $Cs_3RESi_4O_{10}F_2$, wherein RE comprises europium, gadolinium, terbium, dysprosium, holmium, erbium, thulium, ytterbium, lutetium, yttrium, scandium, or a combination thereof, the method comprising:
layering a mixture of $REF_3$ and $SiO_2$ beneath a mixture of CsF and CsCl;
heating the $REF_3$, $SiO_2$, CsF, and CsCl;
cooling the $REF_3$, $SiO_2$, CsF, and CsCl; and
collecting the $Cs_3RESi_4O_{10}F_2$ compound.

15. The method of claim 14, wherein the $REF_3$, $SiO_2$, CsF, and CsCl are heated to a temperature of from about 500° C. to about 1200° C.

16. The method of claim 15, wherein the $REF_3$, $SiO_2$, CsF, and CsCl are slow cooled after heating at a rate of from about 1° C./h to about 20° C./h.

17. The method of claim 16, wherein the $REF_3$, $SiO_2$, CsF, and CsCl are slow cooled to a temperature of from about 300° C. to about 500° C. and then allowed to rapidly cool to room temperature at a rate of from about 30° C./h to about 300° C./h.

18. The method of claim 15, wherein the $REF_3$, $SiO_2$, CsF, and CsCl are maintained at the temperature of from about 500° C. to about 1200° C. for a period of from about 6 hours to about 24 hours.

19. The method of claim 14, wherein the $REF_3$ includes a mixture of $YF_3$ and $EuF_3$.

* * * * *